(12) United States Patent
Park

(10) Patent No.: US 11,190,030 B2
(45) Date of Patent: Nov. 30, 2021

(54) METHOD AND SYSTEM FOR INSPECTING THE SAFETY OF AN ELECTRIC VEHICLE CHARGER

(71) Applicants: HYUNDAI MOTOR COMPANY, Seoul (KR); KIA MOTORS CORPORATION, Seoul (KR)

(72) Inventor: Chil-Seong Park, Anyang-si (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 0 days.

(21) Appl. No.: 16/883,356

(22) Filed: May 26, 2020

(65) Prior Publication Data

US 2021/0143651 A1 May 13, 2021

(30) Foreign Application Priority Data

Nov. 13, 2019 (KR) ........................ 10-2019-0145023

(51) Int. Cl.
*H02J 7/00* (2006.01)
*G01R 31/385* (2019.01)
*B60L 53/60* (2019.01)
*G01R 31/58* (2020.01)
*B60L 3/00* (2019.01)
*B60L 53/16* (2019.01)
*G01R 31/52* (2020.01)

(52) U.S. Cl.
CPC .......... *H02J 7/0029* (2013.01); *B60L 3/0069* (2013.01); *B60L 53/16* (2019.02); *B60L 53/60* (2019.02); *G01R 31/385* (2019.01); *G01R 31/58* (2020.01); *G01R 31/52* (2020.01); *Y02T 90/12* (2013.01); *Y02T 90/14* (2013.01)

(58) Field of Classification Search
CPC ...... H02J 7/0029; B60L 53/16; B60L 3/0069; B60L 53/60; G01R 31/58; G01R 31/385; G01R 31/52; Y02T 90/14; Y02T 90/12
USPC ............................................ 320/109; 701/22
See application file for complete search history.

(56) References Cited

U.S. PATENT DOCUMENTS

2013/0268158 A1* 10/2013 Kurita .................... B60L 3/003
701/32.8
2013/0293188 A1* 11/2013 Bandai ................ H02J 7/00047
320/107

(Continued)

*Primary Examiner* — Zixuan Zhou
(74) *Attorney, Agent, or Firm* — Lempia Summerfield Katz LLC

(57) ABSTRACT

A method of inspecting the safety of an electric vehicle charger includes: fastening a charger connector between a charger side and a vehicle side; checking for an abnormality in the charger and the charger connector by checking for a leakage current; raising a voltage of a quick charger to a voltage of a high-voltage battery of a battery unit by closing a high-voltage battery main relay; charging a motor inverter capacitor of an inverter unit connected to the battery unit by closing the high-voltage battery main relay; opening the high-voltage battery main relay and then closing a quick charge relay of a charging unit connected to the inverter unit; checking whether normal charge is enabled by requesting a normal charge voltage and a normal charge electric current from the vehicle side to the charger side; and forcedly discharging a voltage with which the motor inverter capacitor is charged.

6 Claims, 2 Drawing Sheets

(56) References Cited

U.S. PATENT DOCUMENTS

2013/0342215 A1* 12/2013 Kawamura ............ G01R 31/08
                                                            324/509
2020/0144840 A1*  5/2020 Masuda .................... B60L 3/12

* cited by examiner

METHOD AND SYSTEM FOR INSPECTING THE SAFETY OF AN ELECTRIC VEHICLE CHARGER

CROSS-REFERENCE TO RELATED APPLICATIONS

This application claims priority under 35 U.S.C. § 119 to Korean Patent Application No. 10-2019-0145023, filed on Nov. 13, 2019, in the Korean Intellectual Property Office, the disclosure of which is incorporated herein by reference in its entirety.

BACKGROUND OF THE DISCLOSURE

1. Field of the Disclosure

The present disclosure relates to a method and a system for inspecting the safety of an electric vehicle charger, and more particularly, to a method and a system for preventing a breakdown of an electric vehicle by detecting a short circuit of a connector of a vehicle external quick charger before beginning to quickly charge the electric vehicle.

2. Description of the Related Art

An electric vehicle charging system may be basically defined as a system for charging a battery mounted in an electric vehicle by using electric power from a grid of a commercially available power source or from an energy storage device. Electric vehicle charging systems may have various shapes depending on types of electric vehicles. Examples of the electric vehicle charging systems may include a conductive charging system using a cable, and a wireless electric power transfer system configured to operate in a non-contact manner. When the battery needs to be charged while the electric vehicle travels, the electric vehicle moves on a traveling route to a charge station where the electric vehicle may be charged.

Before beginning to charge the battery, an electric vehicle charger in the related art performs a 'cable check' step of checking whether there is a dielectric breakdown of a cable of the charger and in the charger. More specifically, in the 'cable check' step, in order to check whether there is an abnormality such as a dielectric breakdown at a charger side or an internal short circuit before beginning to charge the battery after a charger connector is fastened, whether there is a leakage of electric current is checked after raising an output voltage at the charger side for a predetermined period of time before closing a quick charge relay and a high-voltage battery relay at a vehicle side. As a result, in the 'cable check' step, it is checked whether there is a dielectric breakdown in the charger and the connector. However, recently, there are cases, at home and abroad, in which the connector of the charger explodes while the battery is charged after the battery begins to be normally charged, even though the 'cable check' step is finished without errors. The explosion may be caused by a short circuit of a high-voltage +/− conductive wire which may result from an inflow of moisture into the charger connector exposed to the outside.

However, it is difficult to check whether there is an abnormality when a short circuit is caused by moisture with high resistance or a short circuit is caused by internal corrosion only by performing the 'cable check' step in the related art, which checks whether there is a dielectric breakdown in the charger and the connector. That is, if an external short circuit occurs in a high-voltage line while charging the battery, moisture may be introduced into a connector of a quick charger exposed to the outside or the connector of the quick charger may be corroded. As a result, a fuse may be melted and cut, and a relay may be fused in the high-voltage battery due to an external short circuit of the high-voltage battery while charging the battery. For this reason, there is a problem in that the vehicle cannot start and travel and thus the vehicle needs to be towed. Further, there is a problem in that components in the high-voltage battery are burnt out and thus the components need to be replaced.

In order to solve the problems in the related art, there is proposed cooperative control that checks whether there is an abnormality of the high-voltage line at the charger side before beginning to normally charge the battery at the vehicle side.

SUMMARY OF THE DISCLOSURE

The present disclosure has been made in an effort to prevent a breakdown of a vehicle by detecting a short circuit of a connector of a vehicle external quick charger before beginning to quickly charge an electric vehicle.

An embodiment of the present disclosure provides a system for inspecting the safety of an electric vehicle charger. The system includes a charger side, including a quick charger, and a vehicle side. The vehicle side includes: a battery unit including a high-voltage battery and a high-voltage battery main relay; an inverter unit connected to the battery unit and including a motor inverter and a motor inverter capacitor; and a charging unit connected to the inverter unit and including a quick charge relay. The system checks whether there is an abnormality in the charger and a charger connector by checking whether there is a leakage current. Checking for the leakage current is done by raising a voltage at the charger side after fastening the charger connector between the charger side and the vehicle side, and then by raising a voltage of the quick charger to a value equal to a voltage of the high-voltage battery by closing the high-voltage battery main relay. The motor inverter capacitor is charged by closing the high-voltage battery main relay, the opening high-voltage battery main relay, and then closing the quick charge relay. The system checks whether normal charge is enabled by performing the normal charge by means of the motor inverter capacitor by requesting a normal charge voltage and a normal charge electric current from the vehicle side to the charger side. A voltage, with which the motor inverter capacitor is charged, is forcedly discharged by means of an operation of the motor inverter.

When an external short circuit of the vehicle is detected by a difference of an output electric current at the charger side and a forced discharge electric current of the motor inverter, and when it is determined that the normal charge is not enabled, the operation of the motor inverter may be stopped, and the quick charge relay may be opened.

When no external short circuit of the vehicle, caused by a difference between an output electric current of the charger side and a forced discharge electric current of the motor inverter, is detected, and when it is determined that the normal charge is enabled for a predetermined period of time after the normal charge begins, the high-voltage battery main relay may be closed, and the high-voltage battery may be normally charged.

Another embodiment of the present disclosure provides a method of inspecting the safety of an electric vehicle charger. The electric vehicle charger includes a charger side including a quick charger and a vehicle side including a battery unit, an inverter unit, and a charging unit. The method includes fastening a charger connector between the charger side and the vehicle side. The method includes checking whether there is an abnormality in the charger and the charger connector by checking whether there is a leakage current by raising a voltage at the charger side. The method includes raising a voltage of the quick charger to a value equal to a voltage of a high-voltage battery of the battery unit by closing a high-voltage battery main relay of the battery unit. The method includes charging a motor inverter capacitor of the inverter unit connected to the battery unit by closing the high-voltage battery main relay of the battery unit. The method includes opening the high-voltage battery main relay of the battery unit and then closing a quick charge relay of the charging unit connected to the inverter unit. The method includes checking whether normal charge is enabled by performing the normal charge by means of the motor inverter capacitor by requesting a normal charge voltage and a normal charge electric current from the vehicle side to the charger side. The method includes forcedly discharging a voltage with which the motor inverter capacitor is charged by means of an operation of a motor inverter of the inverter unit.

The checking of whether the normal charge is enabled may include determining whether an external short circuit of the vehicle is detected by using a difference between an output electric current at the charger side and a forced discharge electric current of the motor inverter. The method may further include stopping the operation of the motor inverter and opening the quick charge relay when the determining of whether an external short circuit of the vehicle is detected determines that the external short circuit of the vehicle is detected and the normal charge is not enabled.

The checking of whether the normal charge is enabled may include determining whether an external short circuit of the vehicle is detected by using a difference between an output electric current at the charger side and a forced discharge electric current of the motor inverter. The method may further include closing the high-voltage battery main relay and normally charging the high-voltage battery when the determining of whether an external short circuit of the vehicle is detected determines that no external short circuit of the vehicle is detected and the normal charge is enabled for a predetermined period of time after the normal charge begins.

According to the embodiments of present disclosure configured as described above, it is possible to check, separately at the vehicle side, a likelihood of an external short circuit in the electric vehicle, thereby preventing damage to components in the vehicle.

DETAILED DESCRIPTION OF THE EMBODIMENTS

Figure 1:
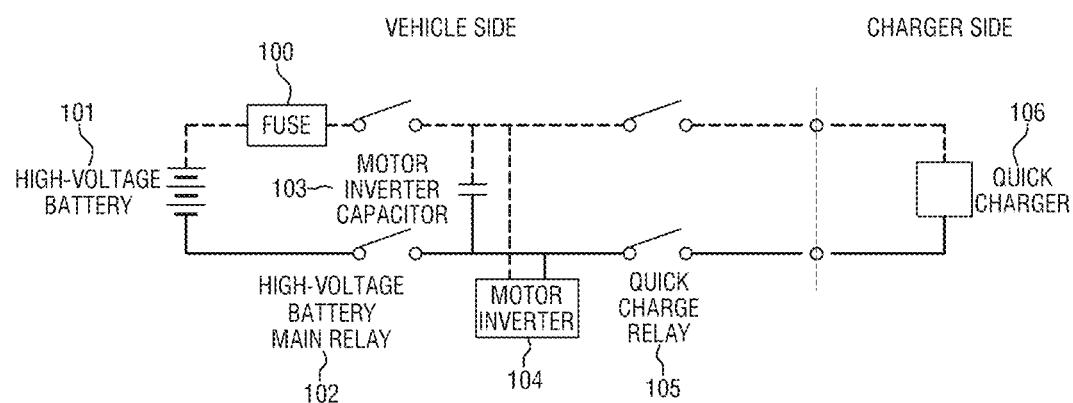
FIG. 1 is a schematic view illustrating a configuration of a system for inspecting the safety of an electric vehicle charger according to an embodiment of the present disclosure.

Hereinafter, the present disclosure is described in detail with reference to the accompanying drawings. However, the present disclosure is not restricted or limited by the disclosed embodiments. Like reference numerals indicated in the respective drawings refer to members which perform substantially the same functions.

An object and an effect of the present disclosure may be naturally understood or may become clearer from the following description. The object and the effect of the present disclosure are not restricted only by the following description. In addition, in the description of the present disclosure, the specific descriptions of publicly known technologies related with the present disclosure have been omitted when it is determined that the specific descriptions may unnecessarily obscure the subject matter of the present disclosure.

FIG. 1 illustrates a configuration of a system for inspecting the safety of an electric vehicle charger according to an embodiment of the present disclosure. As illustrated in FIG. 1, the system for inspecting the safety of the electric vehicle charger according to the embodiment of the present disclosure includes a charger side including a quick charger 106, and a vehicle side including a battery unit, an inverter unit, and a charging unit.

More specifically, referring to FIG. 1, the battery unit includes a high-voltage battery 101 and a high-voltage battery main relay 102. The inverter unit is connected to the battery unit and includes a motor inverter 104 and a motor inverter capacitor 103. The charging unit is connected to the inverter unit and includes a quick charge relay 105.

In this configuration of the system, whether there is an abnormality in the charger and a charger connector is checked first by checking whether there is a leakage current by raising a voltage at the charger side after fastening the charger connector between the charger side and the vehicle side ("cable check" step). In this case, when the voltage is raised at the charger side, the electric current is not detected in the normal case because there is no electric current route. However, if there is an internal abnormality such as a short circuit between a high-voltage line and a charger chassis or a short circuit between +/− terminals of the high-voltage line, the electric current may flow through the short-circuited route. Whether there is a leakage current is checked by a sensor provided in the charger. The sensor detects the electric current flowing through the short-circuited route.

If there is no abnormality in the "cable check" step, the high-voltage battery main relay 102 of the battery unit at the vehicle side is closed. The voltage of the quick charger 106 at the charger side is then raised to a value equal to a voltage of the high-voltage battery 101 at the vehicle side ("free charge" step).

In the related art, when the voltage of the high-voltage battery 101 and the voltage of a charger output become equal to each other after the "cable check" step and the "free charge" step are performed, the quick charge relay 105 is closed and the charging begins. However, according to the present disclosure, a process is performed in which the charging is performed for a predetermined period of time in a state in which the high-voltage battery main relay 102 is opened before the actual charging begins. This process is performed to check whether there is an abnormality of the high-voltage line outside the high-voltage battery.

More specifically, according to an embodiment of the present disclosure, the high-voltage battery main relay 102 is closed after the "cable check" step and the "free charge" step are performed. Thus, the motor inverter capacitor 103 is charged with the voltage equal to the voltage of the high-voltage battery 101.

Thereafter, the high-voltage battery main relay 102 is opened before the quick charge relay 105 is closed, and the quick charge relay 105 is closed after the high-voltage battery main relay 102 is opened in this manner. The reason is that there is concern that an externally short-circuited part of the charger may explode due to energy of the high-voltage battery 101 when the high-voltage battery main relay 102 and the quick charge relay 105 are simultaneously closed in a state in which the external short circuit of the electric vehicle (i.e., the short circuit at the charger side) is suspected. In other words, in order to prevent the energy of the high-voltage battery 101 from being applied to the short circuited part when there is the external short circuit of the electric vehicle (i.e., the short circuit at the charger side), the high-voltage battery main relay 102 is opened before the high-voltage connection is made between the charger and the vehicle, i.e., before the quick charge relay 105 is closed.

Next, whether the normal charge is enabled, i.e., whether there is the external short circuit of the electric vehicle (such as, the short circuit at the charger side) is checked by normally charging the battery by requesting a normal charge voltage and a normal charge electric current to the charger side. The request is made through the communication from the vehicle side in the state in which the high-voltage battery main relay 102 is opened. During the process of checking whether the normal charge is enabled in this manner, the battery is charged only by the motor inverter capacitor 103, and the high-voltage battery main relay 102 remains opened. In this case, the voltage with which the motor inverter capacitor 103 is charged is forcedly discharged by an operation of the motor inverter 104. According to an embodiment of the present disclosure, the electric current of 100 A or higher may be consumed by the forced discharge by means of the operation of the motor inverter 104.

It is possible to detect the external short circuit of the vehicle by using a difference between the forced discharge electric current of the motor inverter 104 and the output electric current at the charger side. When the external short circuit of the vehicle is detected and when it is determined that the battery cannot be normally charged, the operation of the motor inverter 104 is stopped, and the quick charge relay 105 is opened.

When no external short circuit of the vehicle, caused by the difference between the forced discharge electric current of the motor inverter 104 and the output electric current at the charger side, is detected, and when it is determined that the normal charge is enabled for a predetermined period of time after the battery begins to be normally charged by the motor inverter capacitor 103, the high-voltage battery main relay 102 is closed, and the high-voltage battery 101 is normally charged.

Figure 2:
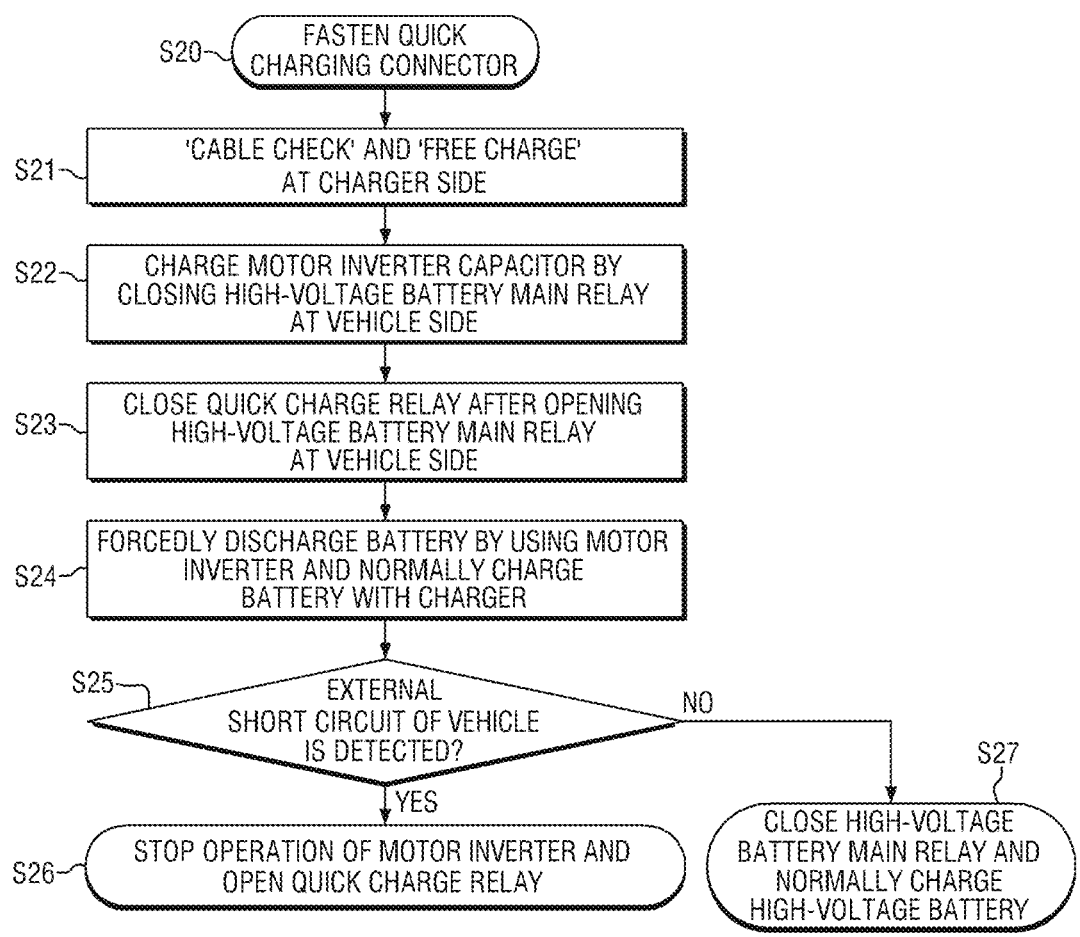
FIG. 2 is a flowchart illustrating an operating mechanism of the system for inspecting the safety of the electric vehicle charger according to the embodiment of the present disclosure.

FIG. 2 is a flowchart illustrating an operating mechanism of the system for inspecting the safety of the electric vehicle charger according to the embodiment of the present disclosure illustrated in FIG. 1. Referring to FIG. 2, the present disclosure may include six steps.

The first step S20 is a step of fastening the quick charger connector between the charger side and the vehicle side. The second step S21 is a step of checking ("cable check") whether there is an abnormality in the charger and the charger connector. Checking for the abnormality is done by checking whether there is a leakage current by raising a voltage at the charger side, and by raising ("free charge") a voltage of the quick charger 106 to a value equal to a voltage of the high-voltage battery 101 of the battery unit by closing the high-voltage battery main relay 102 of the battery unit.

The third step S22 is a step of charging the motor inverter capacitor 103 of the inverter unit connected to the battery unit by closing the high-voltage battery main relay 102 of the battery unit.

The fourth step S23 is a step of opening the high-voltage battery main relay 102 of the battery unit and then closing the quick charge relay 105 of the charging unit connected to the inverter unit.

Thereafter, the process goes to the fifth step S24, such that the normal charge is performed by requesting the normal charge voltage and the normal charge electric current to the charger side by means of communication from the vehicle side. In this step, the voltage with which the motor inverter capacitor 103 is charged is forcedly discharged by the operation of the motor inverter 104 of the inverter unit.

Next, the sixth step S25 is a step of checking whether the normal charge is enabled. In other words, the sixth step is a step of determining whether the external short circuit of the vehicle is detected by using the difference between the output electric current at the charger side and the forced discharge electric current of the motor inverter 104.

When it is determined in the sixth step S25 that the external short circuit of the vehicle is detected and the normal charge is not enabled, the operation of the motor inverter 104 is stopped, and the quick charge relay 105 is opened (S26). When it is determined in the sixth step S25 that no external short circuit of the vehicle is detected and that the normal charge is enabled for a predetermined period of time after the battery begins to be normally charged by the motor inverter capacitor 103, the high-voltage battery main relay 102 is closed, and the high-voltage battery 101 is normally charged.

As described above, since the high-voltage battery begins to be charged after separately inspecting, at the vehicle side, the safety of the charger, it is possible to prevent the high-voltage battery from being burned out and to solve the problems with disabled startups and the replacement of components.

While the present disclosure has been described in detail above with reference to a representative embodiment, those having ordinary skill in the art to which the present disclosure pertains will understand that the embodiment may be variously modified without departing from the scope of the present disclosure. Accordingly, the scope of the present disclosure should not be limited to the described embodiment but should be defined not only by the appended claims but also by all changes or modified forms derived from an equivalent concept to the claims.

What is claimed is:

1. A system for inspecting the safety of an electric vehicle charger, the system comprising:
   a charger side comprising a quick charger; and
   a vehicle side,
   wherein the vehicle side comprises:
      a battery unit comprising a high-voltage battery and a high-voltage battery main relay;
      an inverter unit connected to the battery unit and comprising a motor inverter and a motor inverter capacitor; and
      a charging unit connected to the inverter unit and comprising a quick charge relay,
   wherein whether there is an abnormality in the charger and a charger connector is checked by checking whether there is a leakage current by raising a voltage at the charger side after fastening the charger connector between the charger side and the vehicle side, and then by raising a voltage of the quick charger to a value equal to a voltage of the high-voltage battery by closing the high-voltage battery main relay, wherein the motor inverter capacitor is charged by closing the high-voltage battery main relay, opening high-voltage battery main relay, and then closing the quick charge relay, wherein whether a normal charge is enabled is checked by performing the normal charge by means of the motor inverter capacitor by requesting a normal charge voltage and a normal charge electric current from the vehicle side to the charger side, and wherein a voltage, with which the motor inverter capacitor is charged, is forcedly discharged by means of an operation of the motor inverter.

2. The system of claim 1, wherein, when an external short circuit of the vehicle is detected by a difference of an output electric current at the charger side and a forced discharge electric current of the motor inverter, and when it is determined that the normal charge is not enabled, the operation of the motor inverter is stopped, and the quick charge relay is opened.

3. The system of claim 1, wherein, when no external short circuit of the vehicle, caused by a difference between an output electric current of the charger side and a forced discharge electric current of the motor inverter, is detected, and when it is determined that the normal charge is enabled for a predetermined period of time after the normal charge begins, the high-voltage battery main relay is closed, and the high-voltage battery is normally charged.

4. A method of inspecting the safety of an electric vehicle charger, which includes a charger side comprising a quick charger and a vehicle side comprising a battery unit, an inverter unit, and a charging unit, the method comprising:

fastening a charger connector between the charger side and the vehicle side;

checking whether there is an abnormality in the charger and the charger connector by checking whether there is a leakage current by raising a voltage at the charger side;

raising a voltage of the quick charger to a value equal to a voltage of a high-voltage battery of the battery unit by closing a high-voltage battery main relay of the battery unit;

charging a motor inverter capacitor of the inverter unit connected to the battery unit by closing the high-voltage battery main relay of the battery unit;

opening the high-voltage battery main relay of the battery unit and then closing a quick charge relay of the charging unit connected to the inverter unit;

checking whether a normal charge is enabled by performing the normal charge by means of the motor inverter capacitor by requesting a normal charge voltage and a normal charge electric current from the vehicle side to the charger side; and forcedly discharging a voltage with which the motor inverter capacitor is charged by means of an operation of a motor inverter of the inverter unit.

5. The method of claim 4, wherein the checking of whether the normal charge is enabled comprises determining whether an external short circuit of the vehicle is detected by using a difference between an output electric current at the charger side and a forced discharge electric current of the motor inverter, and wherein the method further comprises stopping the operation of the motor inverter and opening the quick charge relay when the external short circuit of the vehicle is detected and the normal charge is not enabled.

6. The method of claim 4, wherein the checking of whether the normal charge is enabled comprises determining whether an external short circuit of the vehicle is detected by using a difference between an output electric current at the charger side and a forced discharge electric current of the motor inverter, and wherein the method further comprises closing the high-voltage battery main relay and normally charging the high-voltage battery when no external short circuit of the vehicle is detected and the normal charge is enabled for a predetermined period of time after the normal charge begins.

* * * * *